United States Patent [19]
Sakanushi

[11] Patent Number: 5,831,959
[45] Date of Patent: Nov. 3, 1998

[54] LASER CONTROL CIRCUIT IN RECORDABLE OPTICAL DISK DRIVE

[75] Inventor: Yoshihiro Sakanushi, Kanagawa, Japan

[73] Assignee: Mitsumi Elecric Co., Ltd., Tokyo, Japan

[21] Appl. No.: 910,399

[22] Filed: Aug. 13, 1997

[30] Foreign Application Priority Data

Aug. 27, 1996 [JP] Japan ................................. 8-225502

[51] Int. Cl.⁶ ................................................ G11B 7/00
[52] U.S. Cl. ........................ 369/116; 369/121; 372/25
[58] Field of Search .......................... 369/121, 116; 372/25, 26, 29, 38; 347/247

[56] References Cited

U.S. PATENT DOCUMENTS 5,444,728  8/1995  Thompson ............................. 372/38
5,495,464  2/1996  Fujikawa et al. ....................... 369/121
5,519,431  5/1996  Kusano et al. ......................... 347/247

*Primary Examiner*—Tod R. Swann
*Assistant Examiner*—Kim-Kwok Chu
*Attorney, Agent, or Firm*—Whitham, Curtis & Whitham

[57] ABSTRACT

An improved laser control circuit in a recordable optical disk drive is disclosed. The laser control circuit includes a feeding circuit which supplies an auxiliary current into a bypass capacitor provided on a control line of a drive current switching circuit for a laser diode, so that the charge current for the bypass capacitor is increased. Therefore, the required time to start the emission of the laser beam for recording is reduced. The laser control circuit also includes a control circuit which controls the on/off state of the feeding circuit. The control circuit turns off upon detecting to the transition of the state of the drive current switching circuit to the on state, accordingly it ensure the normal operation of the laser control circuit.

7 Claims, 1 Drawing Sheet

LASER CONTROL CIRCUIT IN RECORDABLE OPTICAL DISK DRIVE

BACKGROUND OF THE INVENTION

1. Technical Field of the Invention

The present invention relates to laser control circuit in a recordable optical disk drive, and more particularly, it relates to a laser control circuit in a recordable optical disk drive in which a recording operation starts quickly.

2. Description of Related Art

FIG. 2 shows an example of a conventional laser control circuit in a recordable optical disk drive. The output of a laser diode LD is switched with a pnp transistor Q2, and the on/off operation of the transistor Q2 is controlled by an FET Q1.

In reading opration, switches SW1 and SW2 are off, and a switch SW3 is on, and the transistor Q2 and the FET Q1 are insulated (off) by the switch SW1. Under this condition, only a low level drive current $i_{BIAS}$ flows into the laser diode LD, and a laser beam is emitted at the power level of the reading operation.

In recording operation, in response to data pulses the switches SW1 and SW2 are turned on, while the switch SW3 is tured off, so that a current ($i_R$-$i_{PD}$) obtained by subtracting a current $i_{PD}$, which flows into a monitoring photo diode PD, from a control current $i_R$ charges a bypass capacitor C provided in a circuit by the side of the gate of the FET Q1. When a voltage across the capacitor C exceeds the threshold voltage $V_{TH}$ of the FET Q1, the FET Q1 and the trandistor Q2 are turned on, so that a high level drive current $i_w$ flows into the laser diode LD through the transistor Q2, then with a current ($i_{BIAS}$+$i_W$), laser pulses for recording are emitted. The output level of the laser diode LD is monitored and controlled by the photo diode PD.

In this connection, the control current $i_R$ and the capacitance of the bypass capacitor C determine the time $T_{WR}$, from the moment that the switches SW1 and SW2 are turned on untill the moment that the FET Q1 and the transistor Q2 are turned on. In the case of the CD-R drive device, 270 μsec or less of the time $T_{WR}$ is required. The time $T_{WR}$ may be decreased by increasing the control current $i_R$ or decreasing the capacitance of the capacitor C, however, the upper limit of the control current $i_R$ is determined by the optical system of the pick-up or by the limitation of the recording output. If the value of the capacitance of the capacitor is decreased, noises are mixed with the drive current, which results in the deterioration of the recording laser pulses.

This gives rise to a problem of the decreasing the output time lag of the laser pulses as much as possible thereby to improve the recording performance of the optical disk drive. An object of the present invention is to solve the problem.

SUMMERY OF THE PRESENT INVENTION

The foregoing object if the invention has been achieved by the provision of a laser control circuit in a recordable optical disk drive in which a bypass capacitor is adapted on the control line of a drive current switching circuit which switches the drive current for a laser beam emitting device. According to the present invention, the laser control circuit in the recordable optical disk drive comprises a feeding circuit which supplies an auxiliary current into the bypass capacitor and a control circuit which turns in the current circuit in response to a recording-start signal, and then turns off the current supplying circuit upon detection of the transition of the state of the drive current switching circuit to the on state.

DETAILED DESCRIPTION OF THE PREFFERED EMBODIMENTS

Figure 1:
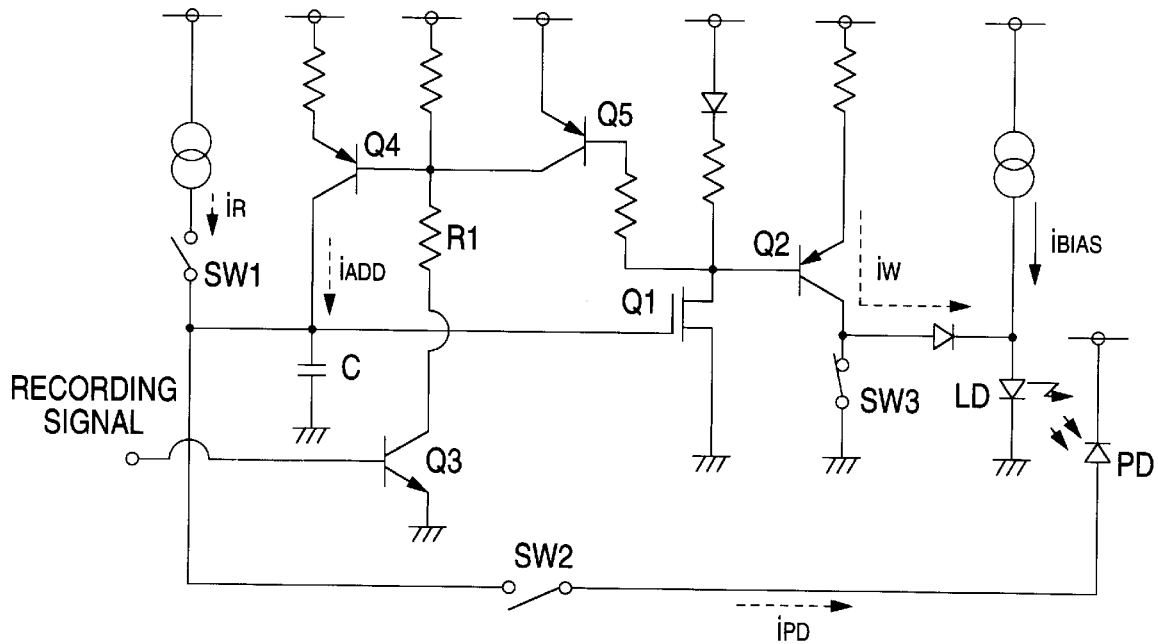
FIG. 1 is a circuit diagram of a laser control circuit in a recordable optical disk drive according to the present invention.
Figure 2:
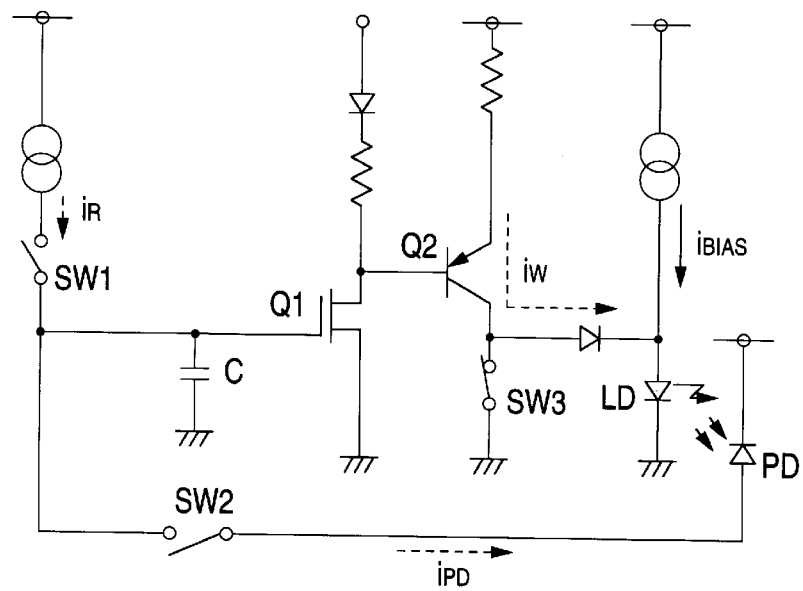
FIG. 2 is a circuit diagram of a conventional laser control circuit in a recordable optocal disk drive.

One Preffered embodiment of the present invention will be described with reference to the accompanying drawings. FIG. 1 shows a laser control circuit in a recordable optical disk drive. The laser control circuit is obtained by adding a feeding circuit comprising a pnp transistor Q4 and a control circuit comprising an npn transistor Q3 and a pnp transistor Q5 to the laser control circuit shown in FIG. 2.

A recording signal line of a read/record prossesor in the optical disk drive is connected to the base of the transistor Q3, so that the on/off state of the transistor Q3 is controled by the recording signal. The base of the transistor Q4 is connected between the collector of the transistor Q3 and a power source, and the collector of the transistor Q4 is connected to the circuit by the side of the gate of FET Q1.

The base of the transistor Q5 is connected between the drain of the FET Q1 and the power source. In the circuit by the side of collector of the transistor Q3, a collector resistor R1 is connected between the collector of the transistor Q3 and the base of the transistor Q4.

Now, the operation of the laser control circuit will be described. At the time of reading, similarly as in the case of the laser control circuit shown in FIG. 2, the switches SW1 and SW2 are off, and the switch SW3 is on, accordingly the FET Q1 and the transistor Q2 are off. Then with the low level of the drive current $i_{BIAS}$ the laser diode LD emits a laser beam in the power of reading level.

At the recording operation, in response to data pulses, the switches SW1 and SW2 are turned on and switch SW3 is turned off, while in response to the recording signal the transistor Q3 is tuened on, and then the base current of the transistor Q4 is decreased, so that the transistor Q4 is turned on. Accordingly a current ($i_R$-$i_{PD}$) obtained by subtracting a current $i_{PD}$, which flows into a monitoring photo diode PD, from a control current $i_R$ and the collector current $i_{ADD}$ of the transistor Q4 charges a bypass capacitor C provided in the circuit by the side of the gate of the FET Q1. That is, in this embodiment, the charge current for the capacitor C is larger than in the laser control circuit shown in FIG. 2, threfore the time required for the voltage across the capacitor C to reach the threshold voltage $V_{TH}$ of the FET Q1 turns on could be highly reduced.

When a voltage across the capacitor C exceeds the threshold voltage $V_{TH}$ of the FET Q1, the FET Q1 and the trandistor Q2 are turned on, so that a high level drive current $i_W$ flows into the laser diode LD through the transistor Q2, then with a current ($i_{BIAS}$+$i_W$), laser pulses for recording are emitted.

Simultoutanously when the FET Q1 is turned on, a current in the base of the transistor Q5 which is connected in the circuit by the side of the drain of FET Q1 is decreased, so that the transistor Q5 is turned on. Hence, the collector current of the transistor Q5 flows into the base of the transistor Q4, so that the transistor Q4 is turned off, accordingly the application of the collector current $i_{ADD}$ into the capacitor C is stopped. Therefore, it is ensured the normal operation, that is, the FET Q1 and the transistor Q2 are turned off when the switches SW1 and SW2 are turned off.

Although the present invention have been described with refference to the preferred embodiment and example thereof, those skilled in the art would appreciate that various modifications, additions and substitutions are possible without departing from the scope and spirit of the invention as recited in the accompanying claims.

What is claimed is:

1. A laser control circuit in a recordable optical disk drive comprising:

a drive current switching circuit which switches a drive current for a laser beam emitting device;

a bypass capacitor connected to a control line of said drive current switching circuit;

a power source which supplies a control current into said bypass capacitor;

a feeding circuit which supplies a auxiliary current into said bypass capacitor; and a control circuit which controls the on/off state of said feeding circuit, wherein said control circuit turns on said feeding circuit in response to a recording signal, and turns off said feeding circuit upon detection of the transition of the state of said drive current switching circuit to the on state.

2. A laser control circuit in a recordable optical disk drive according to claim 1, said control circuit includes a first control circuit and a second control circuit.

3. A laser control circuit in a recordable optical disk drive according to claim 2, the state of said feeding circuit is turned on in response to input of said recording signal into said first control circuit.

4. A laser control circuit in a recordable optical disk drive according to claim 2, the state of said feeding circuit is turned off upon detection of the transition of the state of said drive current switching circuit to the on state.

5. A laser control circuit in a recordable optical disk drive according to claim 1, the on/off state of said drive current switching circuit is controlled by a displacement of a across voltage of said bypass capacitor.

6. A laser control circuit in a recordable optical disk drive according to claim 1, said auxiliary current from said feeding circuit is added to said control current from said power source to reduce required charging time of said bypass capacitor.

7. A laser control circuit in a recordable optical disk drive according to claim 1, said auxiliary current from said feeding circuit is shut out by turning off of said feeding circuit to avoid a error operation of said laser beam emitting device.

* * * * *